United States Patent [19]

Furuyama

[11] Patent Number: 5,719,979
[45] Date of Patent: Feb. 17, 1998

[54] OPTICAL SEMICONDUCTOR MODULE AND METHOD FOR MANUFACTURING THE SAME

[75] Inventor: Hideto Furuyama, Yokohama, Japan

[73] Assignee: Kabushiki Kaisha Toshiba, Kawasaki, Japan

[21] Appl. No.: 531,640

[22] Filed: Sep. 21, 1995

[30] Foreign Application Priority Data

Sep. 28, 1994 [JP] Japan .................... 6-231947

[51] Int. Cl.$^6$ .................................................. G02B 6/43
[52] U.S. Cl. .................. 385/89; 385/94; 385/91; 156/650.1; 156/657.1
[58] Field of Search ................... 385/88–94, 65, 385/59; 156/650.1, 654.1, 657.1

[56] References Cited

U.S. PATENT DOCUMENTS

| | | | |
|---|---|---|---|
| 4,897,711 | 1/1990 | Blonder et al. | 385/88 |
| 5,307,434 | 4/1994 | Blonder et al. | 385/91 |
| 5,412,748 | 5/1995 | Furuyama et al. | 385/92 |
| 5,444,805 | 8/1995 | Mayer | 385/49 |
| 5,535,296 | 7/1996 | Uchida | 385/89 |
| 5,555,333 | 9/1996 | Kato | 385/89 |

FOREIGN PATENT DOCUMENTS

| | | | |
|---|---|---|---|
| 1219806 | 9/1989 | Japan | 385/65 |
| 6-67036 | 3/1994 | Japan | 385/88 |

OTHER PUBLICATIONS

K.P. Jackson et al., "A Compact Multichannel Transceiver Using Planar-Processed Optical Waveguides and Flip-Chip Optoelectronic Components", Proceedings of the 42nd Electronic Components & Technology Conference, p. 94 (1992). [No month].

*Primary Examiner*—John D. Lee
*Assistant Examiner*—Ellen E. Kang
*Attorney, Agent, or Firm*—Finnegan, Henderson, Farabow, Garrett & Dunner, L.L.P.

[57] ABSTRACT

An optical semiconductor module comprises an optical semiconductor element, an optical fiber, a monocrystalline substrate, an airtight sealing member and a reinforcing plate. Light is transmitted through the optical semiconductor element and the optical fiber. The optical semiconductor element and the optical fiber are mounted on the monocrystalline substrate. The optical semiconductor element is sealed airtight by the airtight sealing member. An optical axis aligning mechanism for aligning the optical axis of the optical semiconductor element with the optical axis of the optical fiber is arranged on the monocrystalline substrate. The reinforcing body is welded with metal on the rear surface of the monocrystalline substrate.

15 Claims, 8 Drawing Sheets

OPTICAL SEMICONDUCTOR MODULE AND METHOD FOR MANUFACTURING THE SAME

BACKGROUND OF THE INVENTION

1. Field of the Invention

The present invention relates to an optical semiconductor module wherein optical coupling of an optical semiconductor element and an optical waveguide need not be adjusted.

2. Description of the Related Art

In the field of optical fiber communication, an optical semiconductor module is used, in which optical semiconductor elements, i.e., a laser diodes (a light emitting element) or a light detection element, etc., serving as a signal transmission path are optically coupled, and the optically coupled semiconductor elements and the optical fiber are packaged in an airtight sealing (hermetic sealing) package.

This type of optical semiconductor module is much more expensive than a semiconductor module in which electronic semiconductor elements, such as transistors and ICs, are packaged. This is not because the manufacturing an optical semiconductor element requires a high cost, but mainly because the cost of adjusting optical coupling of an optical semiconductor element and an optical waveguide, such as an optical fiber, is high due to the difficulty in improving the throughput.

In general, an optical semiconductor element and an optical fiber must be positioned with accuracy in the micron order. Positioning by mechanical means, such as a guide mechanism or the like, has a drawback that a mount base, on which the semiconductor elements are mounted, must be worked with great accuracy and complicated, and therefore the base manufacturing cost is considerably increased.

To overcome this drawback, in a conventional optical semiconductor module, an optical semiconductor element and an optical fiber are individually mounted on independent bases or holders. The semiconductor element and the optical fiber mounted on the independent bases or holders are separately examined, and the bases or holders are faced each other, thereby achieving optical coupling. For this reason, mechanical positions of the optical semiconductor element and the optical fiber must be adjusted. In this case, so-called optical coupling adjustment is required, wherein mounting positions are adjusted, while the intensity of an optical input or output is being monitored.

The optical semiconductor element, as described above, must be sealed airtight by a package to ensure reliability, so that a light input/output surface of the optical semiconductor element can be protected. The airtight sealing is achieved by sealing an airtight sealing member made of metal, glass, ceramics or the like, with fusion bonding of metal or glass. For this reason, the sealing step requires a considerably high temperature and the airtight sealing member is thermally deformed greatly.

In a conventional optical semiconductor module, an optical semiconductor element is optically coupled with an optical fiber, after the semiconductor element is sealed airtight. If optical coupling is performed before the sealing step, the mechanical positions may be shifted, since the airtight sealing member easily deformed by heat in the sealing step. In this case, since the optical semiconductor element, which has been sealed, must be optically adjusted to the optical fiber, it is difficult to mechanically detect the mounting position of the optical semiconductor element due to the airtight sealing member. In other words, since positioning cannot be achieved by a guide mechanism, it is difficult to reduce a time required for the step by coarse adjustment of the positions of the optical axes of the optical semiconductor element and the optical fiber by mechanical means. Therefore, the optical axis adjustment, which generally requires accuracy of the micron order, must be performed entirely by optical position detecting means.

Further, after the adjustment of the optical axis, it is necessary to mechanically fix the semiconductor element and the optical fiber firmly to prevent a shift of the optical axis. However, the optical axis may be shifted during the mechanical fixation, since the positional relationship between the members to be fixed is changed, depending on the adjusted state of the optical axis, and the state varies even in the same process conditions.

As described above, in the conventional optical semiconductor module, the throughput cannot easily be improved due to the difficulty in reducing the time required for the step of adjusting optical coupling. In addition, the manufacturing yield cannot be easily improved, because the positional relationship between the members to be fixed is different in every module. Accordingly, the cost for adjusting optical coupling is increased, resulting in a considerably high module cost.

Under the circumstances, there is a demand for an optical semiconductor module, whose manufacturing yield can be improved easily and which can be mass-produced. Some trials for such an optical semiconductor module have been proposed. Of the trials, an optical semiconductor module by application of so-called micromachining, one of the semiconductor manufacturing techniques, has attracted public attention. Since the module produced by the application of the micromachining can be machine-processed with a higher degree of accuracy, i.e., in the submicron order, the positions of an optical semiconductor element and an optical fiber can be adjusted with the accuracy of the micron order by mechanical assembling only, which overcomes a basic problem of the conventional semiconductor module. In other words, optical coupling of an optical semiconductor element and an optical fiber can be achieved only by a mechanical assembling step and adjustment of optical axes as described above is not required. Moreover, since a number of bases can be mass-processed in the same manner as in the case of manufacturing optical semiconductor elements, the cost for processing mount bases is considerably reduced as compared to the conventional cutting processing by means of a machine.

With the above technique, the cost of producing optical semiconductor modules can be reduced and the production yield can be considerably improved. Further, signal transmission of a large capacity and a high quality, which is characteristic to the optical communication technique, can be introduced to industrial machines such as an optical interconnection. As a result, a high speed and high performance system can be constructed, which greatly contributes to development and progress of industry.

However, in the optical semiconductor module to which the micromachining technique is applied, since only the improvement of optical coupling is taken into account, another requirement for practicality, i.e., airtight sealing, has not been achieved. For this reason, such an optical semiconductor module is far from practical use. Drawbacks of the conventional art will be described below with reference to the drawings.

Figure 1:
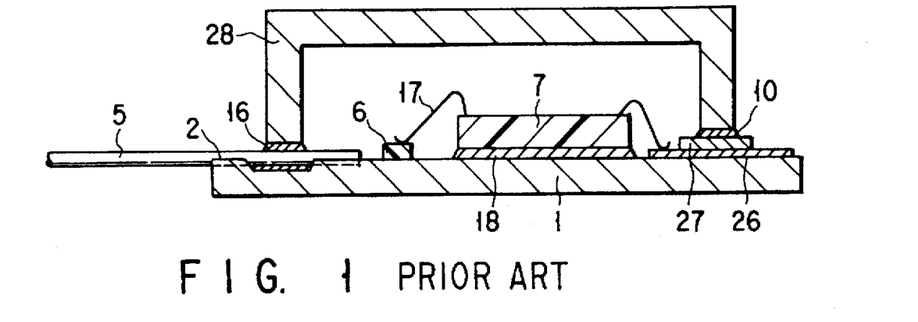
FIG. 1 is a cross-sectional view of a conventional optical semiconductor module.

FIG. 1 is a cross-sectional view of an example of the conventional optical semiconductor module, to which the micromachining is applied. As shown in FIG. 1, the optical semiconductor module comprises an Si substrate 1, an optical fiber 5, an optical semiconductor element 6, an IC 7 for driving the optical semiconductor element 6, and a bonding wire 17. The module further comprises an airtight sealing cap 28, a position adjusting groove 2, an airtight sealing solder 10 for connecting the airtight sealing cap 28 with the Si substrate 1, the airtight sealing solder 16, a solder 18 for the optical semiconductor element 6 on the Si substrate 1, an electrical wiring conductor 26 and an insulator 27.

In this example, the optical fiber 5 is fixed to the position adjusting groove 2 of the Si substrate 1, so that the positional relationship to the optical semiconductor element 6 can be mechanically self-alignment. Therefore, optical coupling can be achieved through mechanical assembling steps of mounting the optical semiconductor element 6 to the Si substrate 1 and inserting the optical fiber 5 to the position adjusting groove 2. The reason why the mounting base is formed of the Si substrate 1 is that the position adjusting groove 2 can be machine-processed by the aforementioned micromachining.

Since, in general, an Si monocrystalline (single-crystalline) substrate can be anisotropically etched due to crystal orientation, it can be processed into various geometric shapes. A typical shape of a groove for the optical semiconductor module is a so-called V groove having slants of (111) planes on both sides, obtained in a case where a slit-like mask in <110> or <-110> direction is formed on the (100) crystalline plane. Monocrystalline Si has a characteristic that the (111) plane is etched much more slowly than the crystalline planes (100) and (110), when etched by an aqueous solution of KOH or hydrazine. The reference numerals (100), (110), and (111) denote the crystalline plane. The reference numerals <110> and <-110> denote the crystal axis.

In the aforementioned anisotropic etching, a V groove can be easily formed utilizing the crystal orientation and the mask used in the etching can be formed in the conventional semiconductor process. Thermal oxidation $SiO_2$ obtained by heat-treating an Si substrate in an oxide atmosphere or an $Si_3N_4$ by CVD (Chemical Vapor Deposition) method is used as a mask in the etching. It is fully possible that the machine processing accuracy obtained by the system is as low as 1 μm, depending on etching conditions and setting of the mask.

As described above, the optical semiconductor module, to which the micromachining is applied, is effective to omit adjustment of the optical coupling. However, since the main purpose of such a module is to omit adjustment of the optical coupling, an airtight sealing mechanism of the optical semiconductor element is not necessarily taken into consideration. Although there has not been many proposals to solve the problems of the airtight sealing mechanism, an example of the solutions is suggested in PROCEEDING of 42nd ELECTRONIC COMPONENTS & TECHNOLOGY CONFERENCE (1992), page 94, FIG. 1. In this example, an airtight sealing cap, for sealing an optical semiconductor element mounting region, is mounted on an Si substrate formed by the micromachining process, thereby achieving partial airtight sealing on the Si substrate. This example is applied to the aforementioned optical semiconductor module utilizing the micromachining, so that the structure shown in FIG. 1 can be easily obtained.

With the above structure, the optical semiconductor element and the optical fiber can be optically coupled with each other by mechanical assembling, and airtight sealing of the optical semiconductor element can be achieved. As a result, the cost of producing optical semiconductor modules can be reduced and the production yield can be considerably improved, so that the above-described effects can be obtained.

However, the optical semiconductor module thus obtained, still having drawbacks from the viewpoint of the practical use, cannot be used in practice. More specifically, in the structure of FIG. 1, an Si substrate is used as a mount base to make the best use of advantages of the semiconductor process technique. However, if the airtight sealing cap 28 is formed of a metal selected to secure airtightness, the thermal expansion characteristic of the Si substrate is not necessarily conform to those of the other members. Further, when a number of electric wiring conductors 26 are required, for example, when optical fibers are arrayed and several tens of leader lines of wiring conductors 26 are required, thermal deformation stress applied to the Si substrate is not negligible, since the area of the Si substrate is increased due to the increase of the number of wiring leaders and the accumulated amount of thermal deformation of the wiring leaders. The thermal deformation results in problems, such as a crack of the Si substrate or package leak due to degradation of the mechanical strength of the airtight sealing portion. Such a problem is liable to lower the reliability of the optical semiconductor module. As a result, the yield in consideration of the reliability is lowered and the advantage obtained by simplification and reduction of the optical coupling steps is lost.

The above problem of low reliability mainly results from the mechanical fragility of Si, the material of the substrate. If, therefore, the substrate is made of ceramics like the general semiconductor package, the problem of low reliability is diminished. However, if the substrate is made of ceramics, various problems arise and the essential object of improving the module is missed. For example, since crystal anisotropy cannot be utilized in the etching process, the accuracy of the etching process is as low as several tens of microns. In addition, the cost of the material of the substrate is increased, or the thermal conductivity of the substrate is lowered. Therefore, it is necessary to give priority to the mechanical workability which is required to omit the adjustment of the optical axis in the optical semiconductor modules. For this reason, use of an Si substrate is indispensable.

As described above, the conventional optical semiconductor module has a limit in reduction of the cost due to the adjustment of the optical axis, whereas application of the micromachining technique, as means for reducing the cost, lacks practicality.

In the conventional semiconductor package, thermal deformation stress applied to the Si substrate is not negligible, since the area of the Si substrate is increased due to the increase of the number of wiring leaders and the accumulated amount of thermal deformation of the wiring leaders. The thermal deformation results in problems, such as a crack of the Si substrate or package leak due to degradation of the mechanical strength of the airtight sealing portion. Such a problem is liable to lower the reliability of the optical semiconductor module. As a result, the yield in consideration of the reliability is lowered and the advantage obtained by simplification and reduction of the optical coupling steps is lost.

SUMMARY OF THE INVENTION

The present invention has been made in consideration of the above problems of the conventional art. Accordingly, a first object of the present invention is to provide an optical semiconductor module, in which a crack of the monocrystalline substrate due to thermal deformation stress on account of the airtight sealing member, so that the productivity and reliability can be improved.

A second object of the present invention is to provide a method for producing an optical semiconductor module for easily producing a reliable optical semiconductor module.

The above objects can be achieved by an optical semiconductor module comprising:

an optical semiconductor element having an optical axis and performing at least one of light emitting and receiving functions;

an optical waveguide body, having an optical axis, for transmitting light in association with the optical semiconductor element;

a monocrystalline substrate, having first and second surfaces, the optical semiconductor element and the optical waveguide body being mounted on the first surface;

an airtight sealing member, formed on the first surface of the monocrystalline substrate, encircling the optical semiconductor element; and a reinforcing body arranged on the second surface of the monocrystalline substrate.

The above objects can be also achieved by an optical semiconductor module comprising:

an optical semiconductor element having an optical axis and performing at least one of light emitting and receiving functions;

an optical waveguide body, having an optical axis, for transmitting light in association with the optical semiconductor element;

an Si substrate, having first and second surfaces, the semiconductor element and the optical waveguide body being mounted on the first substrate, and an optical axis aligning mechanism for aligning the optical axis of the optical semiconductor element with the optical axis of the optical waveguide body being formed on the first surface;

an airtight sealing member, having a main portion and a peripheral portion, the main portion being located on the first surface of the Si substrate; and a reinforcing body, having a thermal expansion characteristic substantially the same as that of the airtight sealing member, arranged on the second surface of the monocrystalline substrate and connected to the peripheral portion of the airtight sealing member.

Further, the above objects can be achieved by an optical semiconductor module comprising:

an optical semiconductor element having an optical axis and performing at least one of light emitting and receiving functions;

an optical waveguide body, having an optical axis, for transmitting light in association with the optical semiconductor element;

an Si substrate, having first and second surfaces, the semiconductor element and the optical waveguide body being mounted on the first substrate, and an optical axis aligning mechanism for aligning the optical axis of the optical semiconductor element with the optical axis of the optical waveguide body being formed on the first surface;

an optical fiber holder, arranged on the first surface of the Si substrate, for holding the optical fiber; and an airtight sealing member, formed on the first surface of the Si substrate, encircling and sealing the optical semiconductor element and the optical fiber holder.

Furthermore, the above objects can be achieved by an optical semiconductor module comprising:

a guide pin for adjusting a position of an optical connector;

an Si substrate having an adjustment groove for adjusting a position where the guide pin is to be connected;

a reinforcing body on which the Si substrate is mounted; and a fixture member, to which the guide pin is fixed, having a spring mechanism for pressing the guide pin into the adjustment groove of the Si substrate.

The above objects can also be achieved by a method for producing an optical semiconductor module comprising:

a guide pin for adjusting a position of an optical connector;

an Si substrate having an adjustment groove for adjusting a position where the guide pin is to be connected;

a reinforcing body on which the Si substrate is mounted; and a fixture member, to which the guide pin is fixed, having a spring mechanism for pressing the guide pin into the adjustment groove of the Si substrate, the method comprising the steps of:

assembling the fixture member and the guide pin;

fixing the fixture member to the reinforcing plate; and fixing the fixture member to the guide pin by non-contact welding.

Further, the above objects can be achieved by a method for producing an optical semiconductor module, wherein a composite pattern of a combination of grooves having different widths is formed on a plane of an Si substrate by anisotropic etching in which etching is substantially stopped at the plane, and thereafter an optical fiber is fixed to the composite pattern, the method comprising the steps of:

forming a wider groove by etching on the Si substrate, using a first rectangular window mask; and forming a narrower groove by etching on the Si substrate, using a synthetic mask comprising a second rectangular window, a predetermined distance apart from the wider groove, and a band-shaped window which is narrower than the second rectangular window and extending from a slant face on a contact portion of the wider groove to the second rectangular window.

According to the optical semiconductor module of the present invention, since the optical semiconductor element can be optically coupled with the optical waveguide body, such as an optical fiber, only by mechanical assembling, the cost for optical axis adjustment is not required and the reliability of the airtight sealing structure is ensured. In addition, since a high reliability is obtained even when the module structure can be formed as an optical connector connection type, reliable optical semiconductor module can be produced with a high productivity. Therefore, the present invention is advantageous in that the manufacturing cost is considerably reduced and the application range is widened. Further, if force in a direction so as to bend the monocrystalline substrate is applied to the substrate due to the stress of the airtight sealing member, the bent can be reduced or set off by the reinforcing body or reinforcing member formed on the rear surface of the monocrystalline substrate. Therefore, the monocrystalline substrate is not cracked.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will be described with reference to the accompanying drawings.

(First Embodiment)

Figure 2:
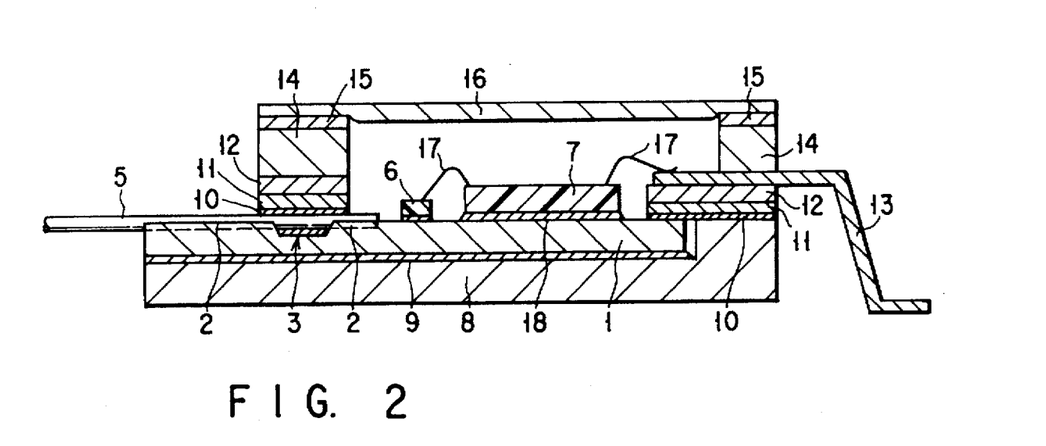
FIG. 2 is a cross-sectional view of an optical semiconductor module according to a first embodiment of the present invention.

An optical semiconductor module according to a first embodiment of the present invention comprises an Si substrate 1, i.e., a mount base, as shown in FIG. 2. An optical semiconductor element 6 and an IC 7 for transmitting or receiving data to or from the optical semiconductor element are mounted on one surface of the Si substrate 1 via solder. An optical axis alignment mechanism is formed on the surface of the Si substrate 1 by the known semiconductor processing technique. The optical axis alignment mechanism includes a guide groove 2 of an optical fiber 5, a portion for defining the mounting position of the optical semiconductor element 6, a metallize and the like. The Si substrate 1 has a solder groove 3, which is filled with airtight sealing solder 10 surrounding an optical fiber 5.

Figure 3:
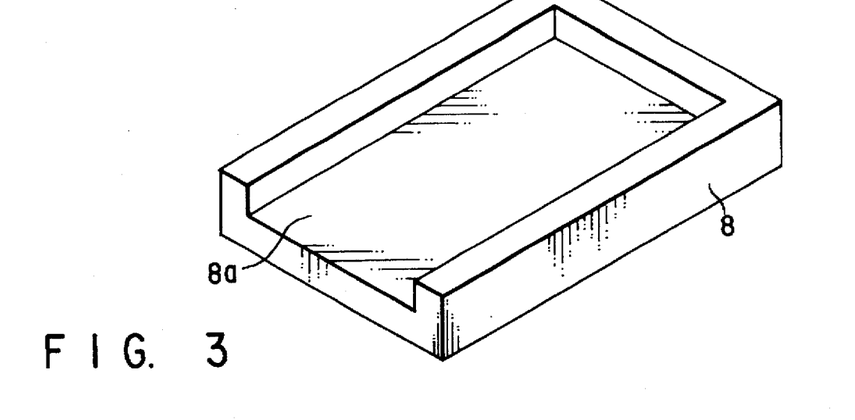
FIGS. 3 to 5 are perspective views of reinforcing members.
Figure 4:
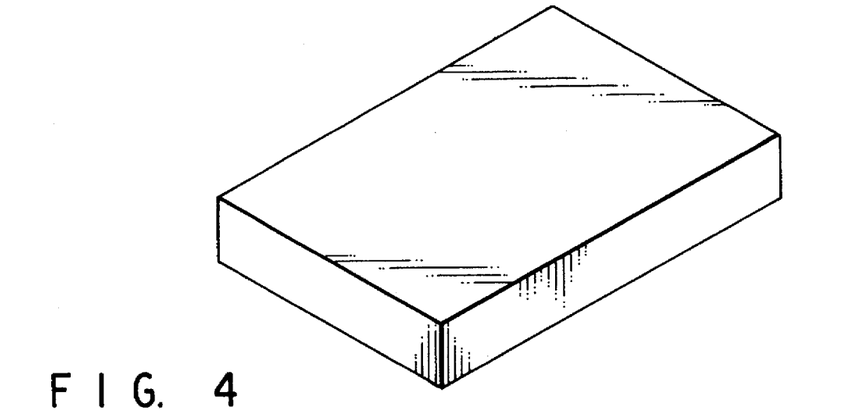
Figure 5:
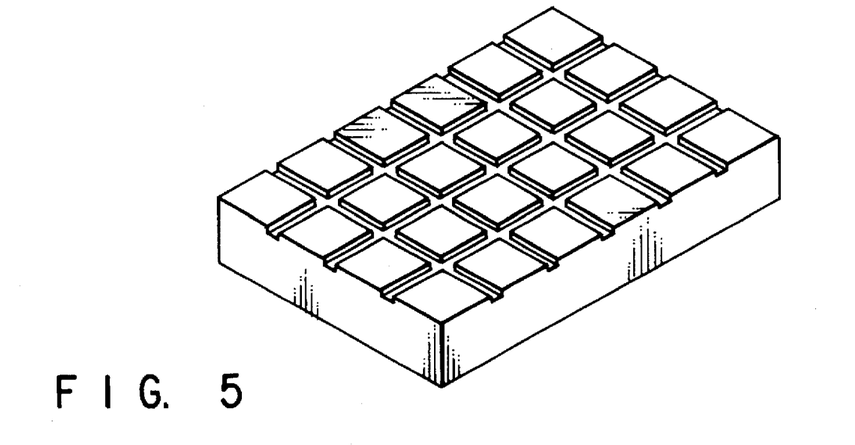

The optical semiconductor module of this embodiment comprises a reinforcing plate 8 for preventing the Si substrate 1 from thermal deformation. As shown in FIG. 3, the reinforcing plate 8 is a box having a bottom surface 8a for receiving the Si substrate 1 and walls on the three sides of the bottom. One end of the reinforcing plate 8 does not have a wall so that optical fibers 5 can be drawn out. The reinforcing plate 8 is need not be plate-shaped, but can be prismatic reinforcing members. A structure as shown in FIG. 4 or 5 can be used as the reinforcing plate 8.

The optical semiconductor module of this embodiment comprises an airtight sealing member. The airtight sealing member is arranged over the Si substrate 1 and the reinforcing plate 8. The airtight sealing member comprises a lower frame 11, an airtight sealing insulator 12, an electrical signal pin 13, an airtight sealing insulator 14, an upper frame 15 and an airtight sealing cap 16.

In the optical semiconductor module of this embodiment, the electrical signal pin 13 is extended from first end portions of the Si substrate 1 and the reinforcing plate 8. The electrical signal pin 13 is connected to the IC 7 through a bonding wire 17. The optical semiconductor element 6 is connected to the IC 7 also through a bonding wire 17. The optical semiconductor element 6 is optically coupled with the optical fiber 5.

In this embodiment, the Si substrate, having a mechanism for mechanically adjusting an optical axis, is mounted on the reinforcing plate 8 and the airtight sealing member is provided thereon. With this structure, the optical semiconductor element 6 is sealed airtight by sealing the bottom of the airtight sealing member with the Si substrate 1. Thermal deformation of the Si substrate 1 and the upper frame 15 of the airtight sealing member is minimized by using suitable material and structure of the reinforcing member 8.

A table indicated below shows the combination of the materials of the reinforcing plate and the sealing member (the sealing cap, the upper frame, the lead frame, the airtight sealing insulator and the lower frame). The following case A is employed as the reinforcing plate and the sealing member of this embodiment.

TABLE

| Member | Case A | Case B | Case C |
| --- | --- | --- | --- |
| Reinforcing plate | metal (Kovar) | ceramics | metal (Kovar) |
| Sealing cap | metal (Kovar) | ceramics or metal (Kovar) | thermoplastic or metal (Kovar) |
| Upper frame | metal (Kovar) | Non | metal (Kovar) or Non |
| Airtight sealing insulator | glass | ceramics | thermoplastic |

TABLE-continued

| Member | Case A | Case B | Case C |
| --- | --- | --- | --- |
| Lead frame | metal (Kovar) | metal (Kovar) | metal (Kovar) |
| Airtight sealing insulator | glass | ceramics | thermoplastic |
| Lower frame | metal (Kovar) | Non | metal or Non (Kovar) |

General requirements for the materials of the reinforcing plate and the sealing member of the present invention and notes on the above table will be described below.

(1) Either metal or ceramics can be used as the reinforcing plate. The combination of the reinforcing plate of ceramics and the upper frame of metal or the combination of the reinforcing plate of metal and the upper frame of ceramics can be used.

(2) The lead frame is formed of a metal is an electric conductor. Kovar (Ni: 29%, Co: 17%, Fe: balance) is most generally used as the adhesive sealing compound. However, an Ni—Fe alloy (Ni: 42%, Fe: balance) or a copper alloy containing a small amount of Cr and Zr can also be used.

(3) Alumina ($Al_2O_3$) or aluminum nitride (AlN) can be used as ceramics.

(4) EVOH, PVdC, PCTFE, or LCP can be used as thermoplastics.

(5) When ceramics are used, a portion of the ceramics to be connected with metal is metallized and thereafter brazed with the metal or soldered.

(6) When thermoplastic is used, it is only necessary that the plastic be molded so as to cover the substrate and a special bonding process is not required.

(7) The above combination of the reinforcing plate and the sealing member should be determined such that the thermal expansion characteristic of the Si substrate 1 and those of the reinforcing plate and the sealing member are well balanced.

Thermal deformation of the Si substrate 1 and the airtight sealing member (11 to 16) generally occurs in a step of assembling an optical semiconductor module or a reflow soldering step in process of mounting the module on a circuit board. However, it can occur even after the module is mounted on the circuit board, due to an internal temperature distribution on the apparatus in which the circuit board is mounted, or a change in the ambient temperature.

The most simple method for suppressing the thermal deformation due to the distribution or change of the temperature is as follows: using the same material to form the parts (11 to 16) of the airtight sealing member, particularly, the frames 11 and 15 and the airtight sealing cap 16 (which are generally formed of metal), using the reinforcing plate 8 made of the same material and of the same shape as the airtight sealing member (11 to 16), and connecting the airtight sealing member and the reinforcing plate 8 in the portions facing each other. With this method, the thermal deformation which occurs between the airtight sealing member (11 to 16) and the substrate Si is set off by the thermal deformation which occurs between the reinforcing plate 8 and the Si substrate 1. As a result, the problem of the conventional art, i.e., a crack of the Si substrate or package leak due to fatigue of the airtight sealing portion, does not easily occur.

In this case, however, the heat resistance between the Si substrate 1 and the reinforcing plate 8 tends to be high, since the reinforcing member 8 is in contact with the Si substrate 1 only under the airtight sealing portion. To prevent this, it is possible to make the reinforcing plate 8 be entirely in contact with the lower surface of the Si substrate 1, as shown in FIG. 2, thereby lowering the heat resistance and to adjust the material and the thickness of the reinforcing plate 8 and the characteristics of the solder. As a result, the thermal deformation can be set off in the same manner as in the aforementioned method.

Figure 6:
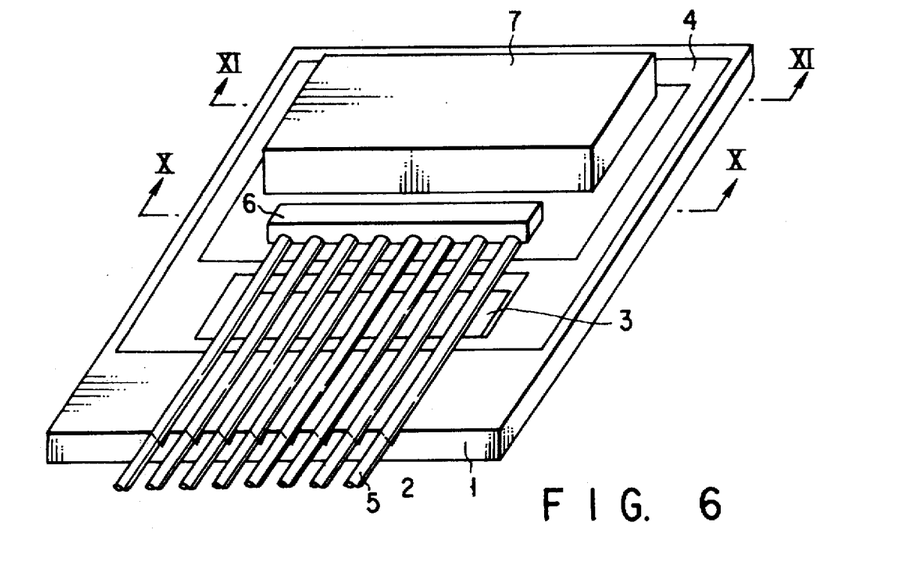
FIG. 6 is a schematic diagram showing an Si substrate used in the module according to the first embodiment.

As shown in the cross-section of the airtight sealing portion in FIG. 6 (perpendicular to the plane of FIG. 1), the rear end and side ends of the reinforcing plate 8 may be directly bonded with the lower frame 11 of the airtight sealing member. With this structure, deformation between the airtight sealing member and the reinforcing plate 8 is directly compensated, thereby increasing the degree of freedom in thermal deformation minimizing design. In addition, since the Si substrate 1 does not expose to the package exterior, protection thereof is ensured.

FIGS. 7A and 7B, 8A and 8B, and 9A and 9B are perspective views mainly showing the Si substrate 1 to be mounted on the optical semiconductor module shown in FIG. 2. A metallize pattern 4 for achieving soldered joint with the airtight sealing member 11 is formed on the Si substrate 1. The metallize pattern 4 is formed by pattern forming through deposition of Au/Pt/Ti and lift-off thereof. The optical semiconductor element 6 and the IC 7 are mounted on a pad metal having the same structure as that of the metallize pattern 4 and a solder (an Au—Sn solder formed by multilayer deposition of Au and Sn) formed on the Si substrate, and then subjected to a heat treatment, thereby connecting the element 6 and the IC 7 with the substrate. In this process, it is possible to employ a so-called flip chip mounting method, in which the elements to be mounted on the substrate are positioned by utilizing the surface tension of fused solder. The solder groove 3 is to cause solder to flow on the rear side of the optical fiber 5, when the airtight sealing member is soldered with the substrate. The solder groove 3 is formed by anisotropic etching of Si in the same manner as in the process of forming the guide groove 2 for adjusting the position of the optical fiber.

Examples of the method for forming the patterns of the guide groove 2 and the solder groove 3, which cross each other, will be described with reference of FIGS. 7A and 7B, 8A and 8B, and 9A and 9B. In the following, the portions, which have already been described, are identified with the same reference numerals as those used above, and detailed descriptions thereof are omitted.

Figure 7A:
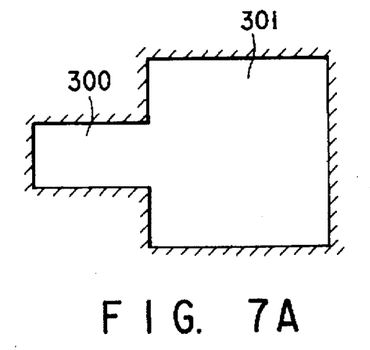
FIGS. 7A and 7B are diagrams showing a first example of anisotropic etching of Si according to the first embodiment.
Figure 7B:
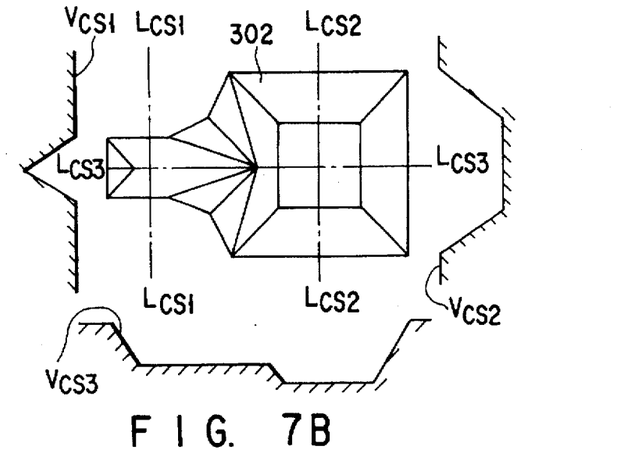
Figure 8A:
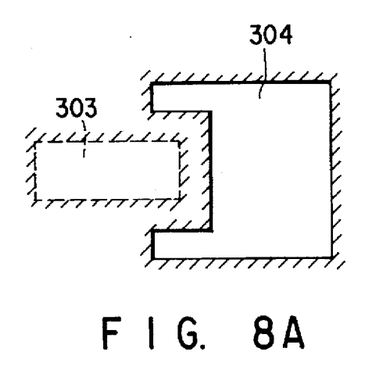
FIGS. 8A and 8B are diagrams showing a second example of anisotropic etching of Si according to the first embodiment.
Figure 8B:
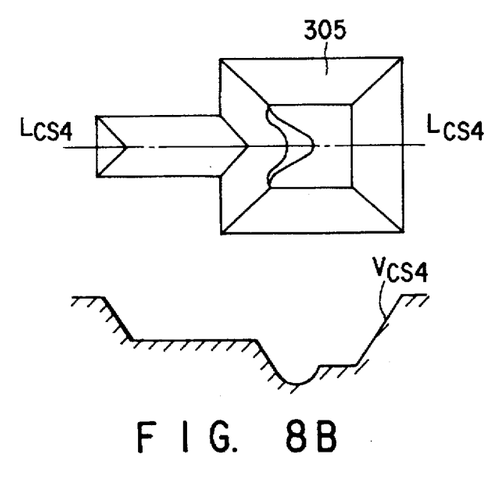
Figure 9A:
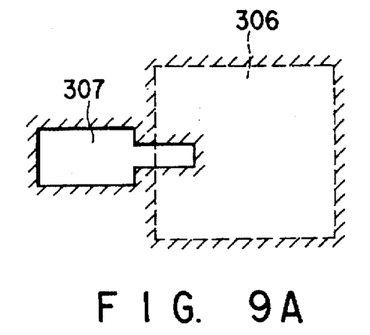
FIGS. 9A and 9B are diagrams showing a third example of anisotropic etching of Si according to the first embodiment.
Figure 9B:
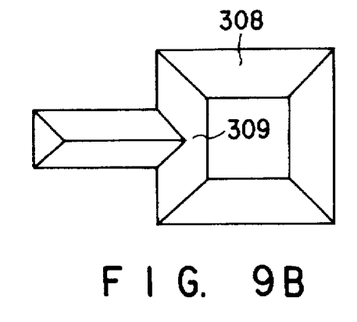

FIGS. 7A, 8A and 9A show shapes of masks, and FIGS. 7B, 8B and 9B show shapes of etched portions (302, 305, 308). The narrower portion (300, 303, 307) of each mask is the guide groove 2 and the wider portion (301, 304, 306) is the solder groove 3.

FIGS. 7A and 7B show a case in which the grooves 2 and 3 are etched simultaneously. As shown in FIGS. 7A and 7B, the portion where the two grooves 2 and 3 cross is etched deeper. In FIG. 7B, the cross section along the line $L_{cs1}$ is indicated as $V_{cs1}$, the cross section along the line $L_{cs2}$ is indicated as $V_{cs2}$, and the cross section along the line $L_{cs3}$ is indicated as $V_{cs3}$. In FIG. 8B, the cross section along the line $L_{cs4}$ is indicated as $V_{cs4}$. As indicated by the cross section $V_{cs3}$, a multi-staged etching region is formed in a peripheral portion of the line $L_{cs3}$. The etching deformation is not preferable, except for a case in which it is negligibly small relative to the dimensions of the overall etched portion. The etching deformation can be prevented by two-staged etching as shown in FIGS. 8A and 8B and 9A and 9B.

FIGS. 8A and 8B show a case in which the narrower groove 303 is etched first, and subsequently, a second mask pattern is prepared to form the wider groove. In this case, the second mask pattern 304 is arranged so as not to cross with the first pattern 303, as shown in FIG. 8A. With this arrangement of the patterns, a cross portion having a geometrical shape is formed as shown in FIG. 8B, so that the etching deformation as shown in FIGS. 7A and 7B can be avoided. However, if the bottom of a wider groove is not completely etched so as to be surrounded by four (111) planes, the portion, which is subjected to etching twice, is etched much deeper (see the cross section $V_{cs4}$. This shape of the etched portion is not preferable, since, in this case, bubbles may be formed in the sealing solder.

FIGS. 9A and 9B show a case in which the wider groove 306 is etched first, and thereafter, the narrower groove is formed, in contrast to the case shown in FIGS. 8A and 8B. In the case of FIGS. 9A and 9B, since the wider groove is first formed independently, even if the bottom of the groove is not completely etched so as to be surrounded by (111) planes, etching deformation does not occur, unless the mask for forming the second groove is not broken. However, it is necessary that the pattern of the narrower groove should not cross with that of the wider groove, and that a much narrower groove be formed in an end portion of the narrower groove so as to reach a slant face of the wider groove, in order to connect the narrower groove with the wider groove. As a result, a projection is formed in the mask 307 of the narrower groove and an etch back region is formed under the mask. However, the etch back region is stopped by a (111) plane extended from the narrower groove on an extension line of a longer side of the mask 307. At this time, it is necessary that the distal end of the narrowest groove pattern be located on the (111) plane on the side of the wider groove 306 and project from an end 309 of the bottom of the narrower groove 307 toward the wider groove side, so as not to reach the bottom of the wider groove, to prevent deformation of the bottom of the wider groove 308 as described above. In this manner, a substantially complete composite groove as shown in FIG. 9B is formed. In this embodiment as described with reference to FIGS. 2 and 6, the grooves are formed in the method shown in FIGS. 9A and 9B.

Figure 10:
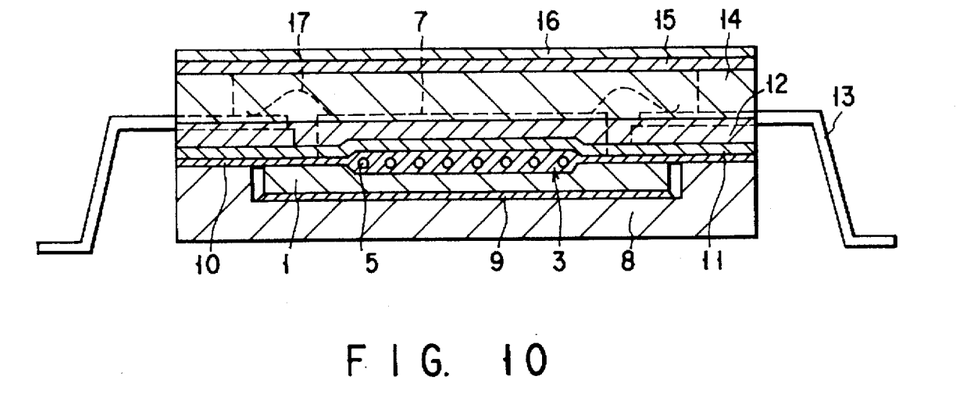
FIG. 10 is a cross-sectional view taken along the line X—X in FIG. 6.
Figure 11:
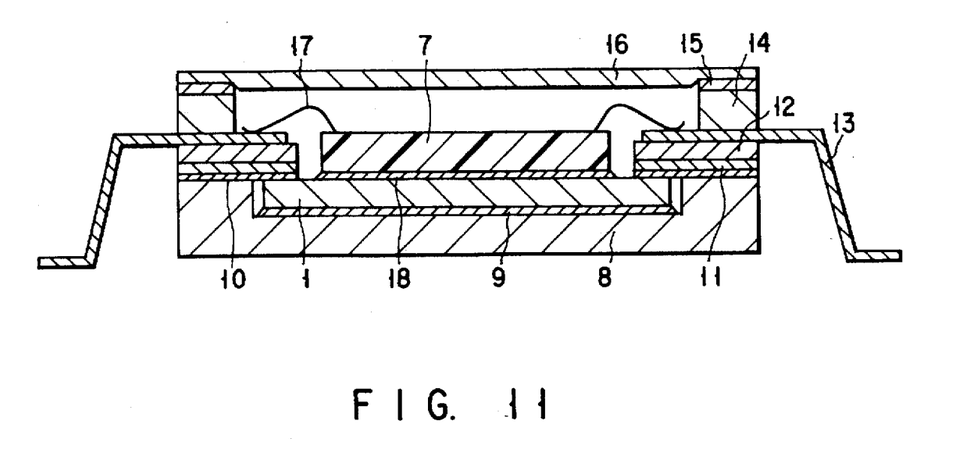
FIG. 11 is a cross-sectional view taken along the line XI—XI in FIG. 6.

FIGS. 10 and 11 are cross-sectional views of the Si substrate 1 formed in the manner as described above, on a plane perpendicular to the plane of FIG. 2.

FIG. 10 shows a cross section in a portion of the solder groove 3 shown in FIG. 6, and FIG. 11 shows a cross section in a portion of the IC 7 for transmitting or receiving data to or from the optical semiconductor element. As described before, the side ends of the reinforcing plate 8 are bonded with the lower frame 11 of the airtight sealing member. FIGS. 2 and 10 clearly show that the upper surface of the Si substrate 1 is sealed airtight. Particularly as shown in FIG. 10, it is clear that the optical fiber 5 is led outside through the sealed portion in the solder groove 3. Thus, the optical semiconductor element 6 and the optical fiber 5 are optically coupled with each other on the Si substrate 1 through the mechanical positioning, thereby ensuring airtightness of the optical semiconductor element 6 and the mechanical strength of the Si substrate 1.

Thus, the optical semiconductor element 6 is sealed airtight and the Si substrate 1 is structurally reinforced without incurring an extra producing cost for optical axis adjustment. It is therefore possible to produce a reliable optical semiconductor module at a low cost.

In addition, since the Si substrate 1, which is a precision processed element, can be mass-produced through semiconductor processes, it is possible to mass-produce optical semiconductor modules without limit by the throughput or cost of precision processed elements.

Figure 12:
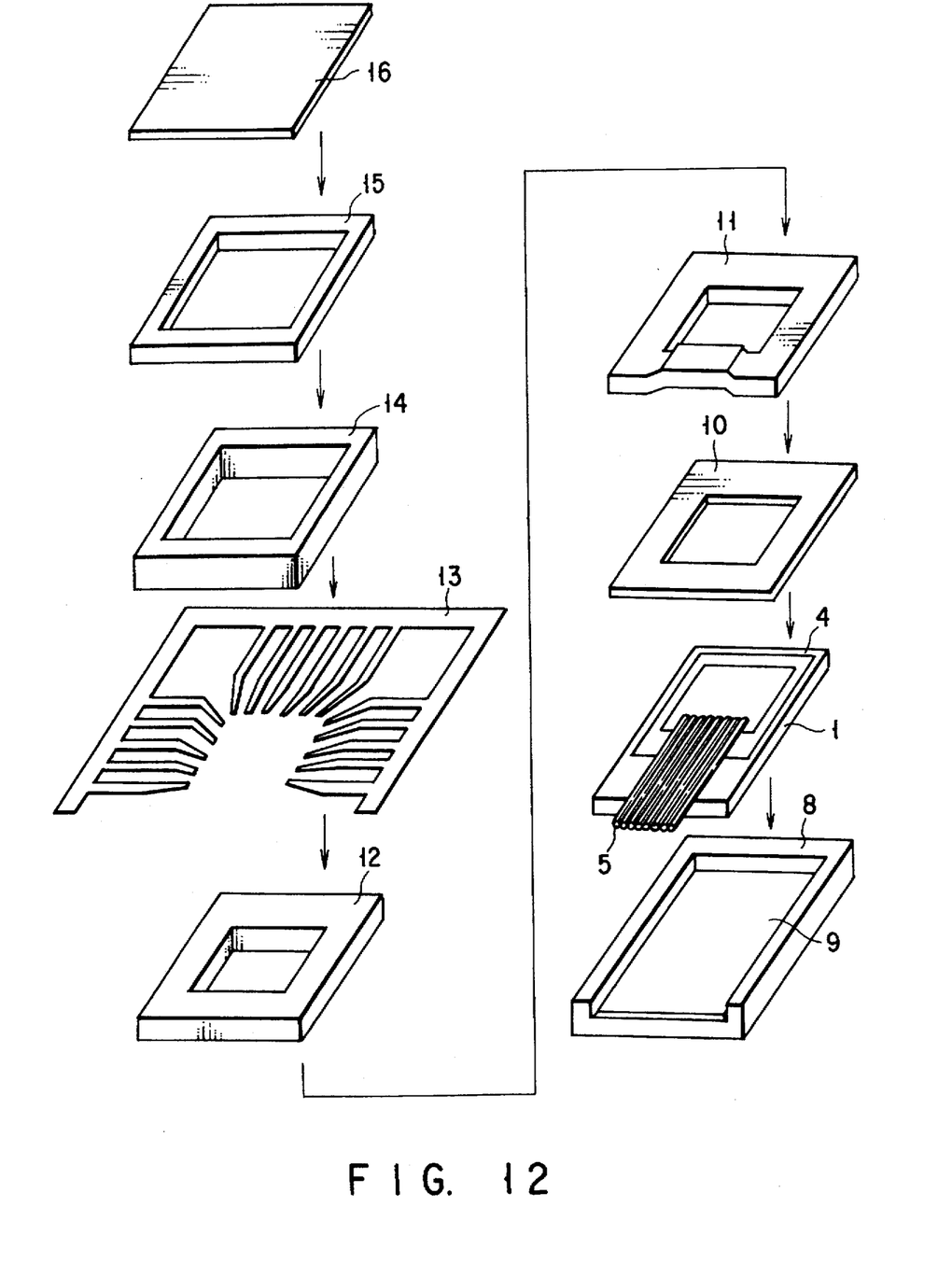
FIG. 12 is an exploded view of parts of the optical semiconductor module of the first embodiment.

A process of producing the above optical semiconductor module will be described. FIG. 12 is an exploded view of the first embodiment of the present invention shown in FIG. 2. Details of the elements, such as the semiconductor element, are not shown or described in the following.

In FIG. 12, the lower frame 11, made of Kovar alloy, has a partially modified optical fiber inserting portion. The sealing insulators 12 and 14 are made of, for example, low melting point glass. The electrical signal pin 13, the upper frame 15 and the airtight sealing cap 16, as well as the lower frame 11, are made of the Kovar alloy.

Since the lower frame 11 has the modified portion, as shown in FIG. 12, which corresponds to the solder groove 3 shown in FIG. 6, the optical fibers can be soldered as shown in FIG. 10. If the lower frame 11 does not have the modified portion, the sealing solder must be considerably thick to achieve airtight sealing, in which case the solder material may flow out or the width of the soldered portion may be different from place to place. In addition, since the lower frame 11 is liable to be brought into contact with the optical fiber 5, stress is easily applied to the optical fiber 5 when the module is assembled. In an extreme case, the optical fiber 5 may be damaged or cut off, in which case the reliability and the yield of the modules will be lowered. The same problem arises in a case where the optical fiber is replaced with an optical wave guide (to be described later).

The process of assembling the module is as follows. First, the lower frame 11, the sealing insulators 12 and 14, the lead frame (the electrical signal pin) 13 and the upper frame 15 are accumulated together and subjected to a heat treatment, thereby forming the aforementioned airtight sealing member as a unit. Then, the optical semiconductor element 6, the IC 7 and the optical fiber 5 are successively or simultaneously mounted on the Si substrate 1 by, for example, soldering. A preform solder 9, the Si substrate 1, the airtight sealing solder 10 and the airtight sealing member (the accumulated member consisting of the parts 11 to 15) are successively accumulated, and the preform solder 9 and the sealing solder 10 are simultaneously caused to reflow. Thereafter, the semiconductor element and the electrical pin 13 are wire-bonded and then, the sealing cap 16 is sealed by means of seam welding. As a result, the optical semiconductor module as shown in FIG. 2 is obtained.

(Second Embodiment)

The first embodiment shown in FIG. 2 is a so-called pigtail type optical semiconductor module, in which optical fibers 5 project from the optical semiconductor module. The pigtail type optical semiconductor module can be changed to an optical connector type optical semiconductor module by changing the structure of the substrate 1. The second embodiment is different from the first embodiment only in the method of mounting the optical fiber on the Si substrate. All the other portions of the second embodiment are the same as in the first embodiment, and the description thereof is omitted.

Figure 13:
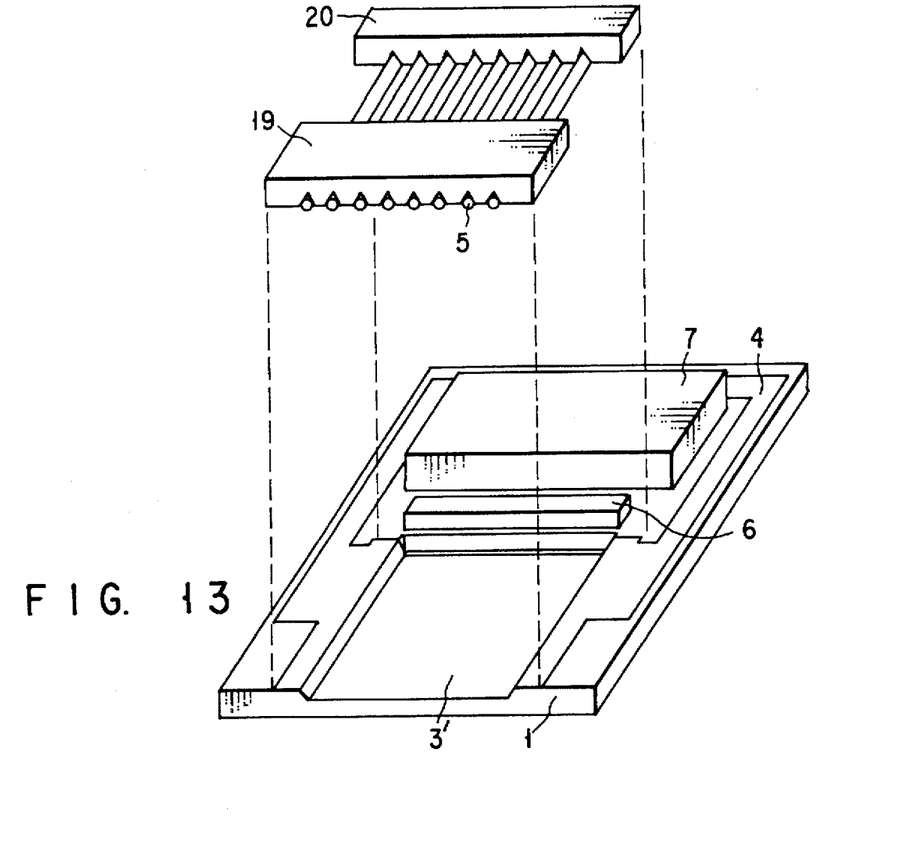
FIG. 13 is a schematic diagram showing an Si substrate used in an optical semiconductor module according to a second embodiment of the present invention.

FIG. 13 shows a state in which elements are mounted on the Si substrate. Optical fiber holders 19 and 20 made of Si comprising v grooves for holding optical fibers can be produced by the same process for producing the Si substrate 1. The optical fiber holders 19 and 20 are arranged in advance such that an optical fiber exposing portion (the gap between the optical fiber holders 19 and 20) for airtight sealing is formed and the optical fibers are attached to the holders and the end faces are shaped by polishing or the like. The optical fiber assembly thus formed is fit in an enlarged solder groove 3' shown in FIG. 13 using the outermost two optical fibers as positioning guides or in the flip chip mounting method for mounting the optical fiber holder 19 itself on the Si substrate 1, thereby optically coupling the fiber assembly with the optical semiconductor element in the same manner as in the embodiment shown in FIG. 2.

Thereafter, the distal end of the optical fiber holder 19 may be polished, so as to be aligned with the end face of the Si substrate 1. The groove on the Si substrate side is flat, because the position of mounting the optical fibers and the arrangement of the optical fiber array is defined on the optical fiber holder side. Further, the purpose of the flat optical groove is to absorb engagement deviation due to a processing error between the optical fiber holder 19 and the Si substrate 1. Therefore, if the groove on the Si substrate side is formed relatively greater, V grooves may be formed also on this side. The above method, in which the optical fibers and the optical fiber holders are assembled into one unit in advance as shown in FIG. 13, is advantageous in that process risks can be dispersed due to separation of assembling steps and the production yield can be improved due to elimination of partial defects.

In the structure shown in FIG. 13, the lower surface of the optical fiber holder 19 is adhered to the upper surface of the Si substrate 1. The height of the optical fibers with respect to the reference surface, i.e., the surface of the Si substrate 1 on which the optical semiconductor element is mounted, is determined with the groove processed accuracy of the optical fiber holder. For this reason, a high process precision is required for both the Si substrate 1 and the optical fiber holder 19. In addition, the step of assembling the optical fiber holder and the substrate requires a high accuracy.

To solve this problem, the following structure may be used. A guide groove for defining the height and position of the optical fiber is formed on the Si substrate side. The grooves on the optical fiber guide side are formed to have a small width, so that the optical fiber holder 19 finally floats above the Si substrate 1.

With this structure, the position and height of the optical fiber is determined only on the Si substrate side, while the advantage of assembling the optical fiber assembly in a separate step is being maintained. If optical fibers are made in an array form, it is necessary that the pitch of the grooves formed in the optical fiber holder 19 should precisely coincide with that of the Si substrate 1. However, there will be substantially no problem, if the grooves on the both sides are formed by photolithography as in the semiconductor process.

In particular, even if the etching depth of the optical fiber holder 19 is slightly changed, the pitch of the grooves will not change. Further, even if the groove width is narrower, this will influence the assembly very little. Therefore, the process accuracy specification is moderated and the process yield can be improved very high.

As a result, since the overall yield is also improved, the above structure is effective to one of the main objects of the present invention, i.e., reduction of the cost of the optical semiconductor module.

In the substrate produced in the manner as described above, a fixing plate 24 and a guide pin 34 are fixed at a weld fixing portion 25 and mounted on the reinforcing plate 8. The fixing plate 24 is not limited to the shape of this embodiment, but can be suitably selected in accordance with an object to be mounted and the shape of the object.

Thereafter, a package is formed to be engaged with an optical connector, in the same manner as in the second embodiment, thereby obtaining an optical connector type semiconductor module. The structure of the optical connector will be described later. The optical semiconductor module thus produced provides the same effect as in the first embodiment.

(Third Embodiment)

A third embodiment differs from the first embodiment in that optical wave guides are partially used in place of the optical fibers. The method for mounting optical fibers on the Si substrate and the structure of the optical connector are also different from the first embodiment. The third embodiment will be described with reference to FIGS. 14 to 16.

Figure 14:
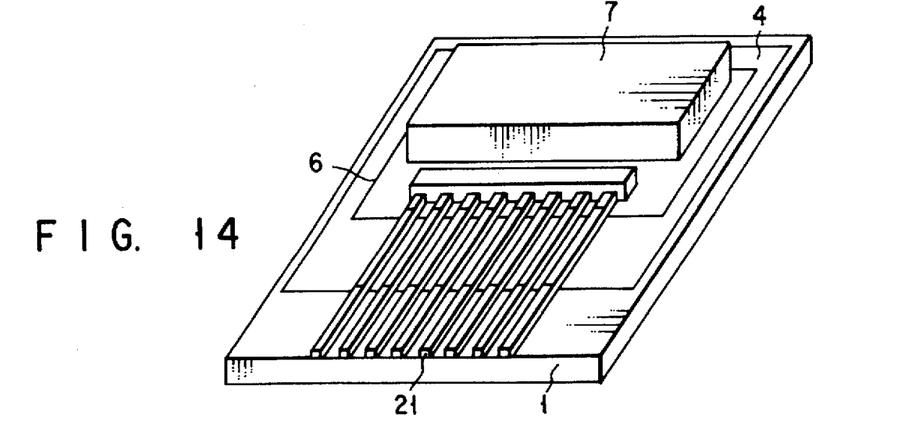
FIGS. 14 and 15 are schematic diagrams showing an Si substrate used in an optical semiconductor module according to a third embodiment of the present invention.

FIG. 14 shows an example in which integrally formed optical waveguides 21 are optically coupled with external optical fibers (not shown). With this structure, an optical fiber assembly need not be prepared in advance. In addition, since the optical waveguides are formed integrally by the semiconductor process, a further reliable optical semiconductor module can be produced at much lower cost.

Figure 15:
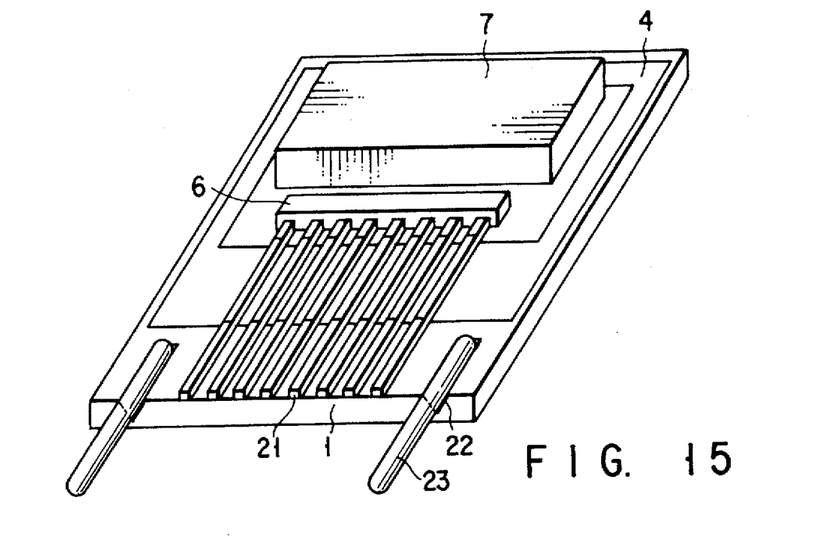

A structure of the optical connector will be described. FIG. 15 shows a structure in which a guide pin groove 22 is formed on the Si substrate 1 shown in FIG. 14 and a guide pin 23 is inserted in the groove. The structure is based on the assumption that there are a plurality of optical transmission and reception channels. An optical connector for ribbon optical fibers on the market, for connecting a plurality of optical fibers, requires adjustment of the central axis of a connector and inclination of arrangement axes of optical fibers.

In general, the adjustment of the axes is performed by using two guide pins. FIG. 15 shows a state in which two guide pins are inserted in the guide pin grooves. The guide pin grooves 22 are formed such that the optical coupling axis thereof is adjusted to the optical axis of the optical semiconductor element, like the optical fiber guide groove and the optical waveguide 21. For this reason, the optical connector and the guide pins are optically coupled only by mechanical assembly as in the embodiment shown in FIG. 1. However, it is not desirable that the guide pins be directly fixed to the Si substrate 1 in consideration of the mechanical fragility of the Si substrate 1. Therefore, although the position adjustment is performed by use of the Si substrate 1, the mechanical fixture of the guide pins and suppression of deviation due to an external force applied to the guide pins should be executed by another measure.

Figure 16:
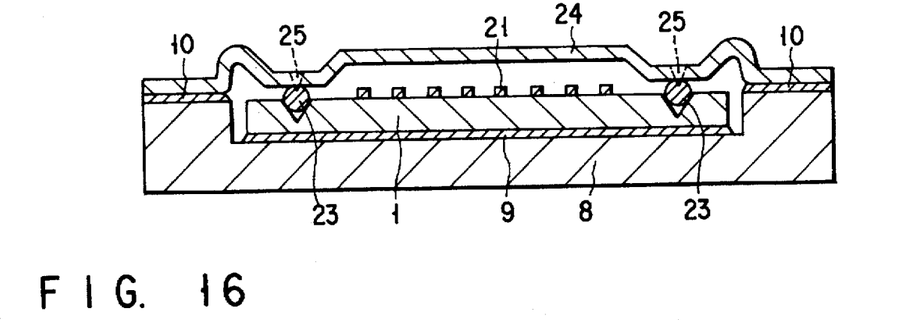
FIG. 16 is a cross-sectional view showing an example of a guide pin fixing portion of the optical semiconductor module of the third embodiment.

FIG. 16 shows the third embodiment using the Si substrate 1 shown in FIG. 15. A fixture plate 24 for fixing the guide pins 23 has bent portions as shown in FIG. 16, so that it can be deformed by external force. In other words, the fixture plate 24, having a function of a spring, presses the guide pins 23 against the guide pin grooves. The fixture plate 24 is welded with the guide pins 23 at weld fixture portions 25. The fixture plate 24 shown in FIG. 16 is mounted on the substrate, with the guide pins inserted, in a preform solder reflow step in the assembling process similar to that in the embodiments shown in FIGS. 2 to 14. A solder 10, serving as adhesive, is contracted in a process in which a melted solder is cooled and hardened. The solder 10 therefore works so as to move both ends of the fixture plate 24 down with respect to the two guide pin contact portions. As a result, the guide pins 23 are pressed into the guide pin grooves of the Si substrate 10 by the elasticity of the fixture plate 24. In this state, it is only necessary that the guide pins 23 be fixed to the fixture plate.

In this embodiment, since the guide pins 23 are fixed to the fixture plate 24 and pressed into the guide pin grooves of the Si substrate 1 by the elasticity of the fixture plate 24, the guide pins 23 are accurately positioned by the Si substrate 1 and positional deviation of the guide pins 23 due to external force is suppressed by the fixture plate 24. Thus, both precise positioning of the guide pins and mechanical strength of the connector can be simultaneously achieved. In this state, the effect of the positioning mechanism by micromachining is maintained, while the fragile Si substrate 1 is protected. For this reason, crack is not formed in the Si substrate 1 in the positioning step or great stress due to external force is not applied to the Si substrate 1. Therefore, a sufficient reliability with respect to mechanical stress can be obtained.

As described above, the guide pins 23 must be fixed to the fixture plate 24 with a sufficient mechanical strength, preferably by welding, particularly non-contact welding, such as laser welding or electron beam welding, in order to avoid positional deviation or stress due to external force in the welding process.

Further, in order to correct fine deviation between the guide pins and the fixture plate, press the guide pins into the guide pin grooves of the Si substrate 1 in the same direction, and keep the position of the inserted guide pins constant, it is necessary that the guide pins 23 be fixed to the fixture plate 24, preferably after the fixture plate 24 is fixed to a supporting body, i.e., the reinforcing plate 8 in FIG. 16, and the fixture plate 24 is pressed against the guide pins 23. In the third embodiment, the same effect as in the first embodiment can be obtained.

(Fourth Embodiment)

Figure 17:
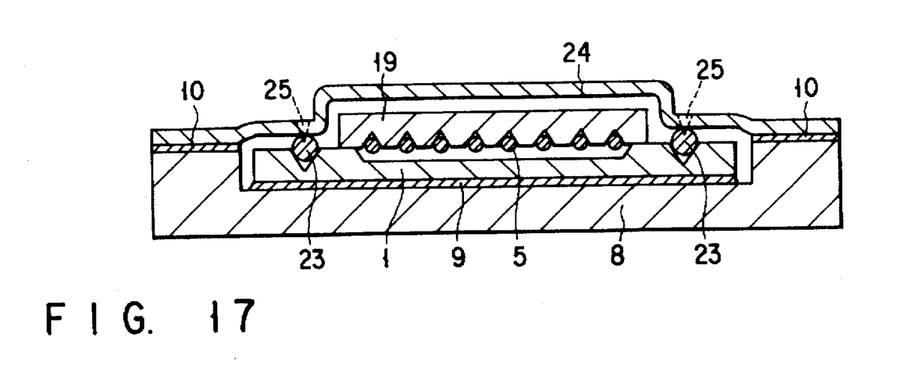
FIG. 17 is a cross-sectional view showing another example of a guide pin fixing portion of the optical semiconductor module of the third embodiment.
Figure 18:
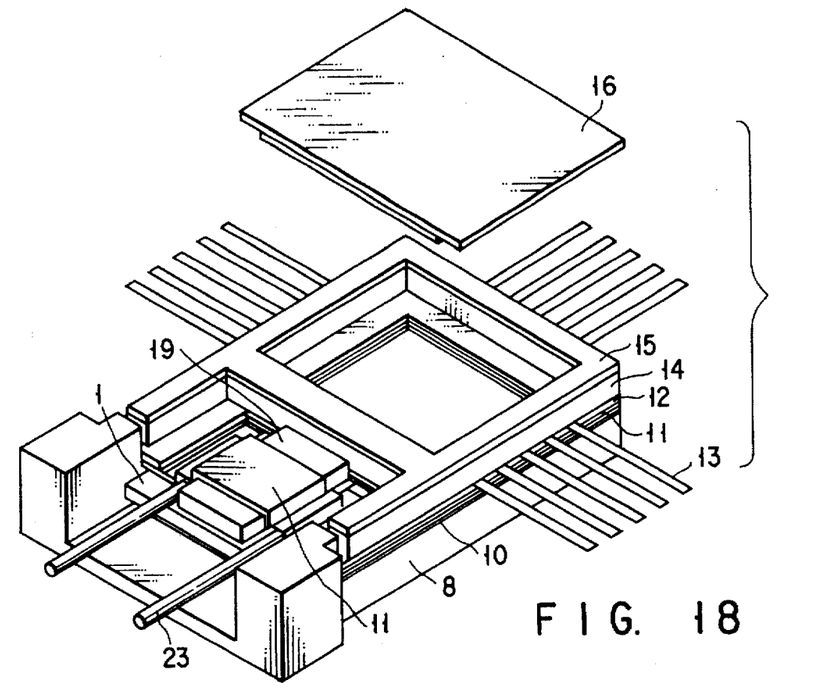
FIG. 18 is a cross-sectional view of an optical semiconductor according to a fourth embodiment of the present invention.

In FIGS. 16 and 17, the fixture plate 24 is additionally provided. However, to reduce cost by reducing the number of parts, the structure as shown in FIG. 18 can be employed. In FIG. 18, an end of a reinforcing plate 8 is worked into two stages to serve as a housing for holding a ferrule of an optical connector. In this embodiment, the lower frame 11 is extended in advance so as to function as a fixture plate and deformed into a predetermined shape in guide pin inserting portions. Then, parts as shown in FIG. 12, including the lower frame 11, is assembled into a unit, thus reducing the number of parts and manufacturing steps. Further, since the number of times of treating parts in assembling is reduced, errors in handling the parts are reduced, resulting in improvement of the yield. Thus, the overall cost is reduced and the productivity is improved. The structure of the fourth embodiment is substantially the same as that of the second embodiment except for the shape of the fixture plate. Needless to say, this embodiment also provides the other effects of the second embodiment.

(Fifth Embodiment)

Figure 19:
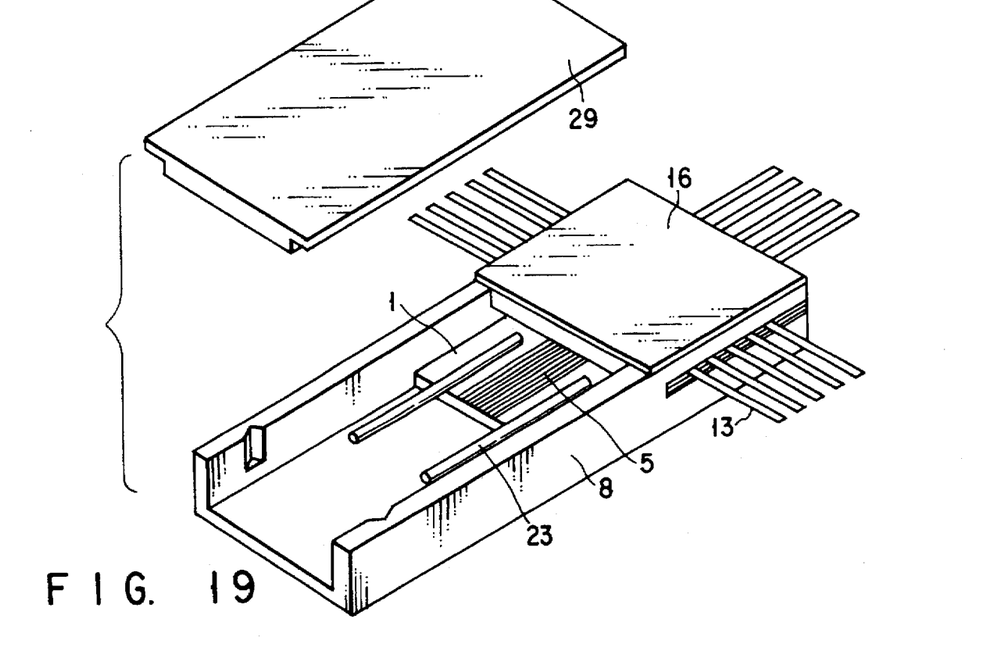
FIG. 19 is a cross-sectional view of an optical semiconductor according to a fifth embodiment of the present invention.

FIG. 19 shows a fifth embodiment, which is different from the first embodiment only in that guide pins 23 are enclosed by a reinforcing plate 8 and an airtight sealing cap 29 and are not exposed to the outside.

The structure shown in FIG. 19 is preferable to provide the optical semiconductor module of the present invention with much higher reliability. In this structure, since the guide pins 23 are positioned by means of the Si substrate 1, it is preferable that the guide pins 23 be located within the optical connector portion, whether a fixture plate is employed or not. If the distal ends of the guide pins 23 project outside, unexpected external force may be applied through the guide pins 23 to the Si substrate 1. In this case, when the module is handled or mounted on a circuit board or when the circuit board is maintained, a shock or excessive force is applied to the guide pins, so that the Si substrate 1 may be easily broken. Thus, it is necessary that the distal ends of the guide pins should not project outside, in a case where the positioning is performed by means of the Si substrate. With the structure of the fifth embodiment, the reliability is ensured even when the module is handled after the production thereof is completed. Needless to say, this embodiment also provides the other effects of the first embodiment.

As has been described above, the optical semiconductor element can be optically coupled with an optical waveguide, such as an optical fiber, and the optical semiconductor element can be airtight sealed only by a mechanical assembling process. Moreover, since the reinforcing plate is attached on the rear surface of the Si substrate, the Si substrate can be prevented from crack due to the stress of the airtight sealing cap. The present invention allows reduction in manufacturing cost of the semiconductor module, substantial improvement of the productivity thereof, and assured reliability. The present invention also allows a large-capacity and high-quality signal transmission, which has been characteristic to the optical communication technology, to be applied to general industry equipment.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An optical semiconductor module adapted to a plurality of optical transmission and reception channels, comprising:

a monocrystalline substrate having first and second surfaces;

an optical semiconductor array formed on the first surface of the monocrystalline substrate, having a plurality of optical axes, for performing light emitting and receiving functions;

an optical fiber array formed on the first surface of the monocrystalline substrate, having a plurality of optical axes, for transmitting light received and emitted by the optical semiconductor array;

an optical axis aligning mechanism, formed on the first surface of the monocrystalline substrate, for aligning the optical axes of the optical semiconductor array with the optical axes of the optical fiber array;

an airtight sealing member formed on the first surface of the monocrystalline substrate for forming an airtight seal around the optical semiconductor array and a portion of the optical fiber array; and a reinforcing body formed on the second surface of the monocrystalline substrate and thermally connected to a part of the airtight sealing member, and having a thermal expansion characteristic substantially equal to that of the airtight sealing member.

2. The optical semiconductor module according to claim 1, wherein the reinforcing body is soldered by metal to the second surface of the monocrystalline substrate.

3. The optical semiconductor module according to claim 1, wherein a material and a shape of a mount surface of the reinforcing body are determined depending on characteristics of the monocrystalline substrate.

4. The optical semiconductor module according to claim 1, wherein a material of the reinforcing body is determined depending on a material of the airtight sealing member.

5. The optical semiconductor module according to claim 1, wherein the reinforcing body has a shape which defines an arrangement on the monocrystalline substrate.

6. The optical semiconductor module according to claim 1, wherein the reinforcing body and the airtight sealing member are formed of materials selected from the group consisting of metal, ceramics and thermoplastic.

7. The optical semiconductor module according to claim 1, wherein the monocrystalline substrate has an Si substrate.

8. The optical semiconductor module according to claim 1, wherein the monocrystalline substrate includes:

an engaging groove for aligning the optical axes of the optical fiber array with the optical axes of the optical semiconductor array, such that the monocrystalline substrate does not contact the optical fiber array.

9. The optical semiconductor module according to claim 1, wherein a part of a peripheral portion of the airtight sealing member is connected to the reinforcing body, and the monocrystalline substrate is arranged inside a connect portion of the airtight sealing member.

10. The optical semiconductor module according to claim 1, further comprising:

an optical fiber array holder for holding a portion of the optical fiber array which projects from the first surface of the monocrystalline substrate.

11. The optical semiconductor module according to claim 10, wherein:

the optical fiber array holder is formed on the first surface of the monocrystalline substrate and aligns the optical axes of the optical semiconductor array with the optical axes of the optical fiber array.

12. The optical semiconductor module according to claim 10, wherein:

the optical fiber array holder is comprised of a plurality of optical fiber holder members.

13. The optical semiconductor module according to claim 10, wherein:

The optical fiber array holder defines a position on the first surface of the monocrystalline substrate at which the optical fiber array holder is mounted, and the optical axes of the optical semiconductor array and the optical axes of the optical fiber array are aligned with each other by mounting the optical fiber array holder to the defined position on the first monocrystalline substrate surface.

14. The optical semiconductor module according to claim 10, wherein the monocrystalline substrate includes:

an engaging groove for aligning the optical axes of the optical fiber array with the optical axes of the optical semiconductor array, such that the monocrystalline substrate is not brought into contact with the optical fiber array holder.

15. A method for producing an optical semiconductor module, wherein a composite pattern of a combination of grooves having different widths is formed on a plane of an Si substrate by anisotropic etching in which etching is substantially stopped at the plane, and thereafter an optical fiber is fixed to the composite pattern, the method comprising the steps of:

forming a wider groove by etching on the Si substrate, using a first rectangular window mask; and forming a narrower groove by etching on the Si substrate, using a synthetic mask comprising a second rectangular window, a predetermined distance apart from the wider groove, and a band-shaped window which is narrower than the second rectangular window and extending from a slant face on a contact portion of the wider groove to the second rectangular window.

* * * * *